(12) United States Patent
Tran

(10) Patent No.: US 6,373,342 B1
(45) Date of Patent: Apr. 16, 2002

(54) JITTER REDUCTION CIRCUIT

(75) Inventor: Hiep V. Tran, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/620,428

(22) Filed: Jul. 20, 2000

(51) Int. Cl.[7] ............................................... H03B 5/24
(52) U.S. Cl. ...................... 331/57; 331/34; 331/177 R; 327/281; 327/288
(58) Field of Search ............................... 331/14, 8, 17, 331/18, 25, 34, 36 C, 57, 177 R, 177 V; 327/272, 278, 281, 288

(56) References Cited

U.S. PATENT DOCUMENTS 4,804,929 A * 2/1989 Kato et al. .................... 331/57
5,594,391 A * 1/1997 Yoshizawa .................... 331/57
5,666,088 A * 9/1997 Penza .......................... 331/34
6,137,371 A * 10/2000 Fukaishi ...................... 331/57

* cited by examiner

*Primary Examiner*—David Mis
(74) *Attorney, Agent, or Firm*—Dwight N. Holmbo; Wade James Brady III; Frederick J. Telecky Jr.

(57) ABSTRACT

A circuit for improving the performance of a charging capacitor inverter used in VCO and similar circuits. The disclosed approach is used to provide both trip point and charging current delay control to reduce the amount of "jitter" associated with the circuit. Trip point delay control is accomplished by adding an in-line transistor, output in a typical charged capacitor inverter, between the charging capacitor and the circuit. The threshold of this transistor is controlled by a dc bias level (control voltage) which allows this transistor to turn "ON" or "OFF" when the node voltage of the capacitor reaches the controllable preset level. Further control of the circuit's delay is obtained by means of circuitry which allows the amount of capacitor charging current to be selected.

5 Claims, 11 Drawing Sheets

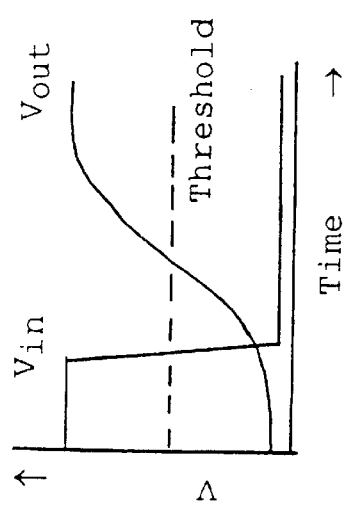
Fig. 1c related art
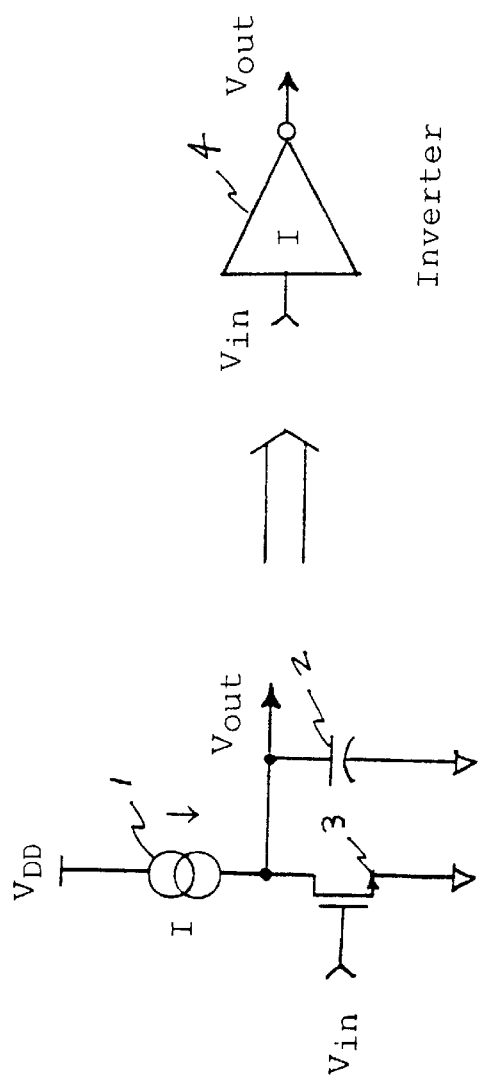
Fig. 1b related art
Fig. 1a related art

JITTER REDUCTION CIRCUIT

BACKGROUND OF THE INVENTION

1. Field of the Invention

The present invention relates to voltage controlled oscillators (VCO) and similar circuits which suffer from "jitter" problems caused by a circuit delay and more specifically to the control of this delay element by means of a new trip point control delay circuit and/or by means of selectable capacitor charging current sources.

2. Description of the Related Art

The delay element in many typical VCO and/or similar circuits uses a current charging capacitor circuit, shown schematically in FIG. 1a. This basic circuit is comprised of a current source 1, a capacitor 2, and a control transistor 3. When the input voltage $V_{in}$ is such as to turn "OFF" the transistor 3, current (I) from current source 1 will charge the capacitor 2. Likewise, when input voltage $V_{in}$ is such as to turn "OFF" the transistor 3, current (I) from current source 1 will flow through transistor 3 and capacitor 2 will discharge.

The basic circuit of FIG. 1a is an inverter since it's output is complementary to it's input. FIG. 1b illustrates the inverter symbol 4 used to represent this circuit in this patent.

FIG. 1c shows a timing diagram for the circuit of FIG. 1a for the case where input voltage $V_{in}$ goes "LOW", relative to the threshold voltage, turning "OFF" transistor 3. The output $V_{out}$ is determined by the charging rate of the capacitor 2, as shown with a relative slow rise time depending on the circuit's time constant.

FIG. 2 shows the basic inverter circuit of FIG. 1 as used in one application; e.g., a voltage controlled oscillator (VCO). The circuit consists of three inverters 5–7 and three charging capacitors 8–10. The output of the first inverter 5 is coupled to capacitor 8 and to the input of the second inverter 6. Similarly, the output of inverter 6 is coupled to capacitor 9 and to the input of inverter 7. Finally, the output of the third inverter 7 is coupled to capacitor 10 and is also fed back to the input of inverter 5. The circuit output is taken off capacitor 10 at the output of inverter 7. The frequency of this oscillator is determined by the output signal slew rate, which is largely determined by the charging and discharging rate of the capacitors.

A problem often associated with a circuit like that of FIG. 2, is one of "jitter", caused by a threshold band where the input voltage $V_{in}$ is applied to the control transistors. FIG. 3a illustrates that for rather slow switching times there can be a relatively large amount of uncertainty, known as "jitter", in the circuit's response.

FIG. 3b illustrates the desired relationship between the transistor threshold and output slew rate to provide substantially less "jitter" in the circuit.

SUMMARY OF THE INVENTION

A circuit for improving the performance of a charging capacitor inverter, used in voltage controlled oscillators (VCO's) and other similar circuits, is disclosed. The techniques used include both trip point control and charging current control to improve the response time of the circuit and to reduce the amount of "jitter" in the circuit.

In the first approach, an in-line transistor is placed between the node of the capacitor of a typical current charging capacitor circuit and the output. The threshold of this transistor is controlled by a dc bias level (control voltage) which allows this transistor to turn "ON" or "OFF" when the node voltage of the capacitor reaches a controllable preset level. The slew rate of the circuit's output is increased considerable by means of a "pull-UP/DOWN" transistor coupled to the output. As a result, the "jitter" in the circuit is significantly reduced. In addition, the circuit delay can be further controlled changing the capacitor charging current in the circuit.

Two embodiments of the invention are disclosed; the first covering the fundamental trip point voltage control approach, and the second incorporating both current delay control and trip point delay control in the same circuit to provide for both fine and coarse adjustment of the delay in the circuit.

The improvements of this invention will positively impact applications such as, but not limited to, voltage controlled oscillators, delay lines, DRAMs, microprocessors, and latches.

DESCRIPTION OF THE VIEWS OF THE DRAWINGS

The included drawings are as follows:

FIG. 1a is a circuit diagram for a basic charging capacitor inverter circuit. (related art)

FIG. 1b shows the symbol for the inverter of FIG. 1a as used in this patent application. (related art)

FIG. 1c shows a typical timing diagram for the inverter circuit of FIG. 1a. (related art)

DETAILED DESCRIPTION

Figure 2:
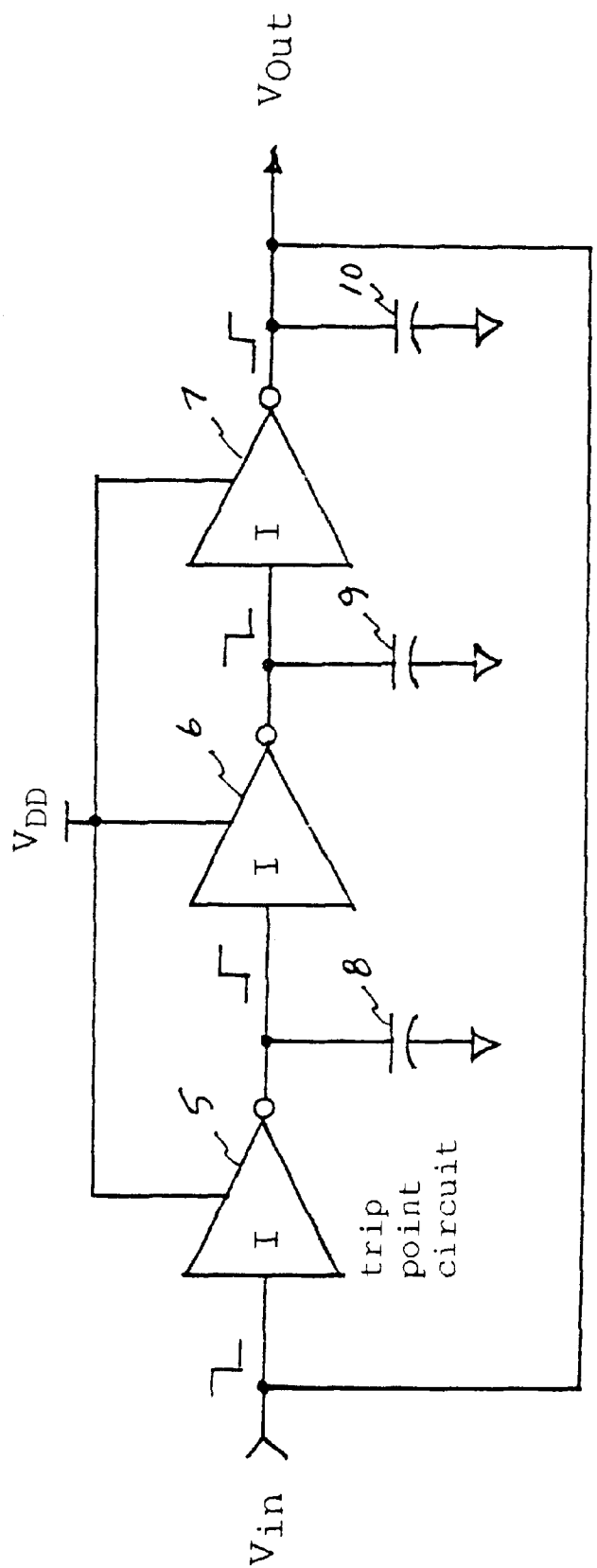
FIG. 2 is a schematic diagram for a typical VCO using three of the inverter circuits of FIG. 1a. (related art)
Figures 3A, 3B:
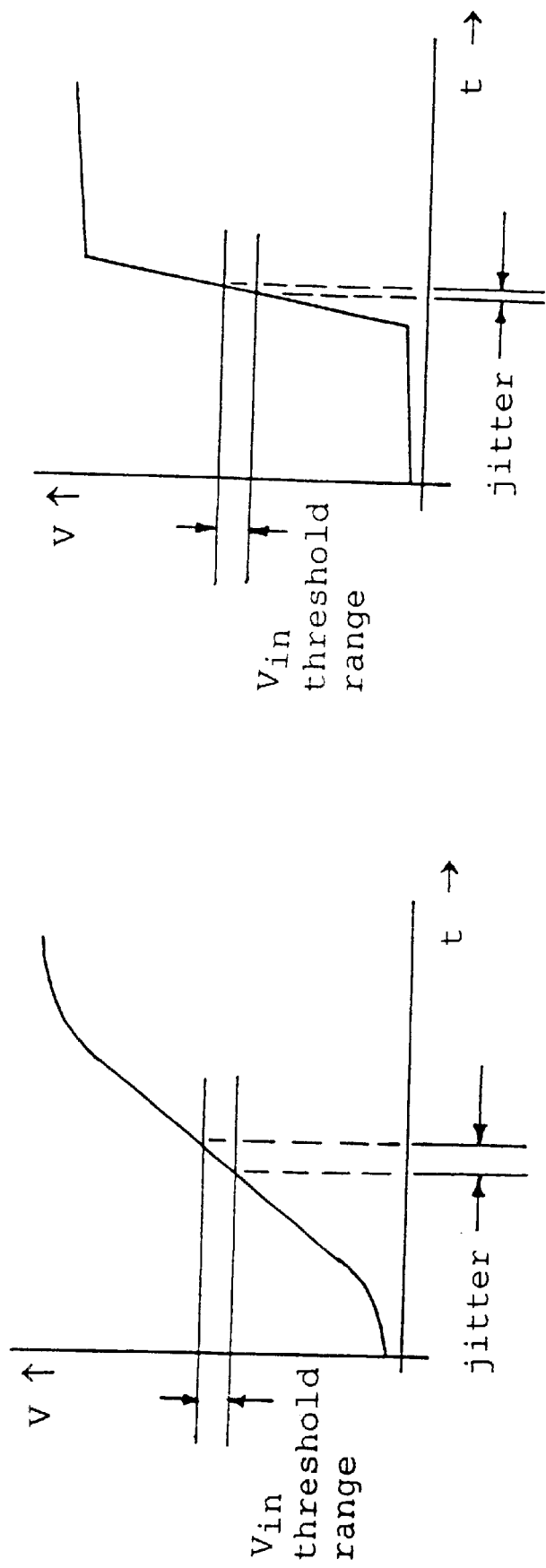
FIG. 3a illustrates the results of "jitter" caused by the delay for a typical circuit like that of FIG. 2. (prior art)
FIG. 3b illustrates the reduced "jitter" for the circuit of this invention.
Figure 4:
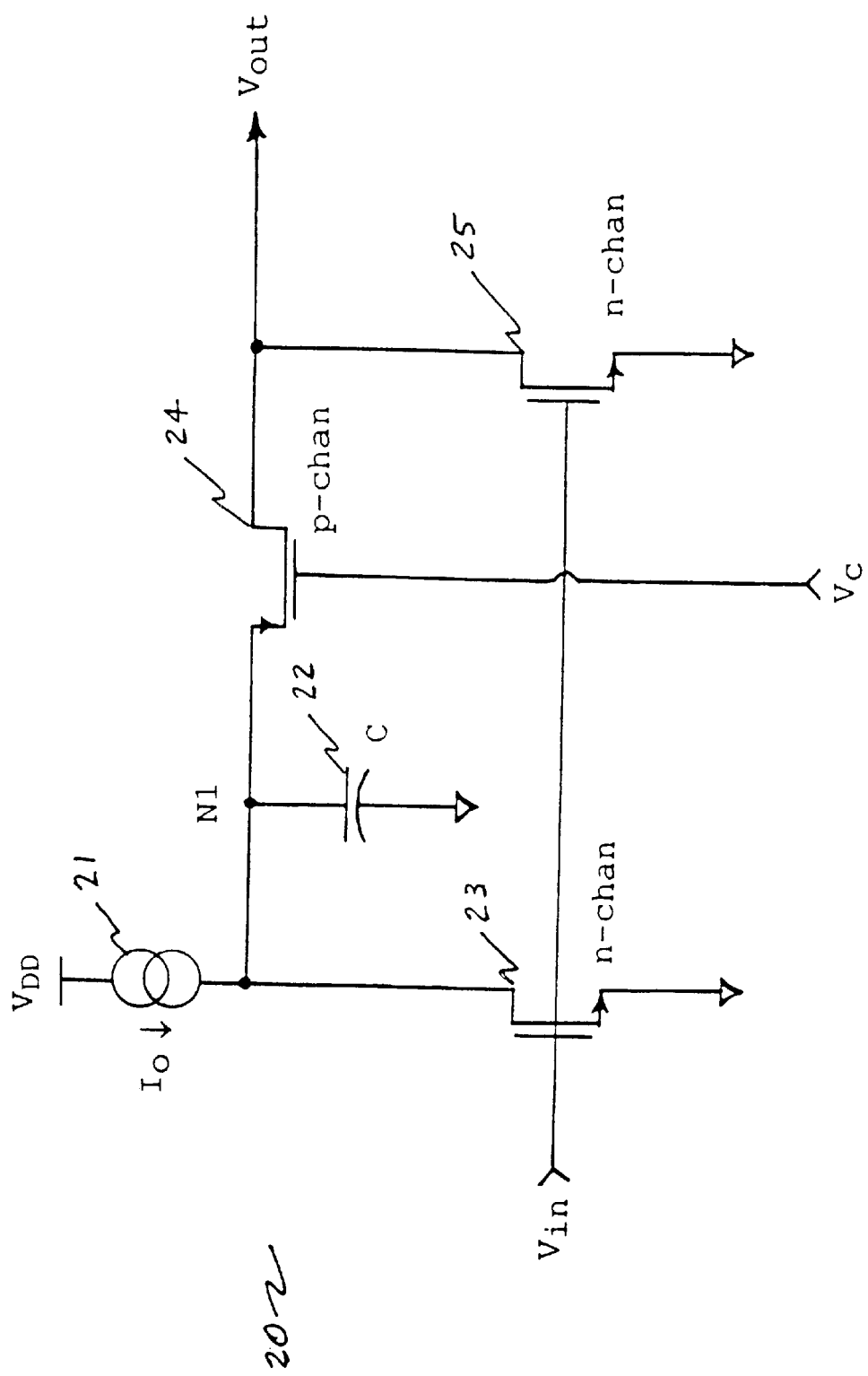
FIG. 4 is a schematic for the basic inverter circuit of this invention with trip point delay control.

FIG. 4 is a schematic for the basic circuit 20 of one embodiment of the disclosed invention with trip point delay control. The circuit is comprised of an inline transistor 24 and an additional "pull-UP/DOWN" output transistor 25 added to a more or less conventional charging capacitor inverter consisting of a current source 21, a charging capacitor 22, and an input transistor 23. In operation, when input transistor 23 is turned "OFF" and "ON", as determined by the input voltage Vin relative to the threshold voltage $V_{th}$ of input transistor 23, capacitor 22 charges and discharges, respectively. Also, when the input voltage $V_{in}$ goes 'HIGH' and/or 'LOW', the output voltage $V_{out}$ is rapidly pulled 'LOW' and/or 'HIGH', respectively, relative to the node voltage N1 of the capacitor 22. The overall circuit delay is controlled by the in-line transistor 24 by means of a dc bias voltage ($V_c$) applied to the gate of the transistor. This in-line transistor 24 conducts when the voltage at capacitor node N1 exceeds the threshold level of the transistor, which consists of the dc bias $V_c$ plus the gate-to-source voltage, $V_t$, of the transistor. As a result, the amount of delay in the circuit can be controlled, within practical limits, by changing the dc bias level, $V_c$. As shown, transistors 23 and 25 are n-MOS technology and transistor 24 is p-MOS technology, although other type devices could be used.

Figure 5:
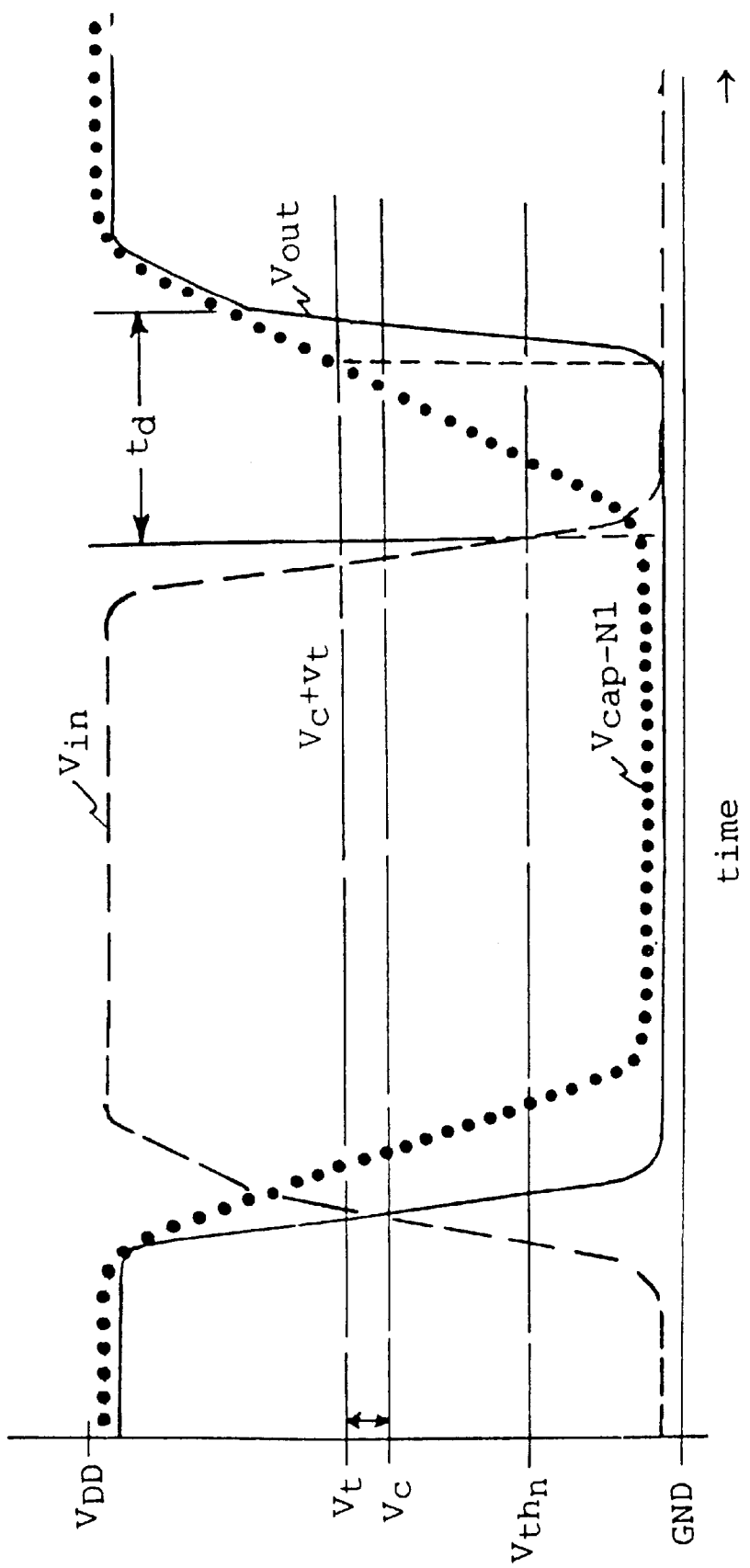
FIG. 5 is a timing diagram for the basic inverter circuit of FIG. 4 with trip point delay control.

FIG. 5 shows the timing diagram for the circuit of FIG. 4, discussed above. This figure shows the improved slew rate of the circuit over that of typical charging capacitor inverter alone. The diagram plots the $V_{in}$, $V_{out}$, and capacitor $V_{cap}$-N1 voltages. The slew rate improvement over conventional circuits of this type can be seen by comparing the fast "rise" and "fall" times of $V_{out}$ to that of the capacitor node $V_{cap}$-N1, which is the output in a conventional circuit. As illustrated, the $V_{out}$ signal makes the high-to-low transition very fast after some delay time from the $V_{in}$ signal. The $V_{out}$ signal's low-to-high transition is also fast, but there is a delay time ($t_d$) from the time that output transistor 25 turns "OFF" and in-line transistor 24 turns "ON", pulling the $V_{out}$ signal "high." The in-line transistor 24 turns "ON" when the capacitor node voltage reaches the dc level of the control voltage ($V_c$) plus the transistor's gate to source voltage ($v_t$). The $V_{out}$ signal then pulls "HIGH" at a fast rate until it reaches the level of the capacitor $V_{cap}$-N1 voltage, and then rise at the charging rate of the capacitor. So, there exist a delay from the time output transistor 25 turns "OFF" and the output signal rises to the value of the capacitor node. This delay is controllable by changing the control voltage ($V_c$) dc level.

Figure 6:
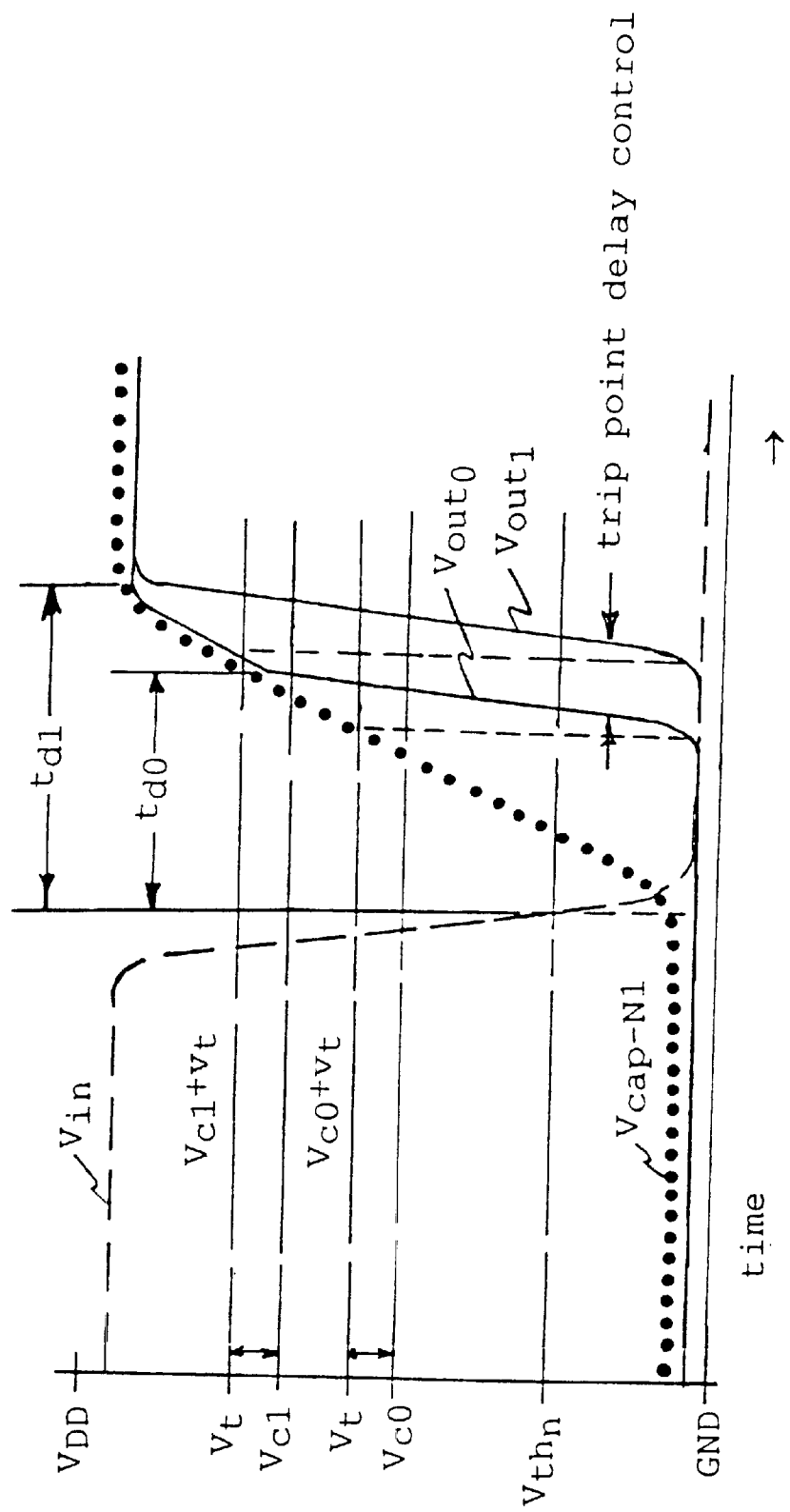
FIG. 6 is a timing diagram showing the effects of controlling the trip point delay in the circuit of this invention.

FIG. 6 illustrates the trip point delay control, used to control the amount of delay in the circuit's output signal. The delay is controlled by varying the dc bias voltage $V_c$ at the gate of the in-line, p-channel transistor 24. As shown, by changing the dc bias voltage from $V_{c0}$ to $V_{c1}$, the output signal's delay is increased from $t_{d0}$ to $t_{d1}$. As discussed above, this delay is caused by the fact that the output voltage ($V_{out}$) cannot pull "high" until the capacitor node ($V_{cap}$-N1) charges to the level of $V_c+V_t$, the control voltage ($V_c$) plus the in-line transistor's gate to source voltage ($v_t$), allowing in-line transistor 24 to turn "ON". So, by changing the level of the trip point control voltage, $V_c$, the amount of circuit delay can be controlled.

Figure 7A:
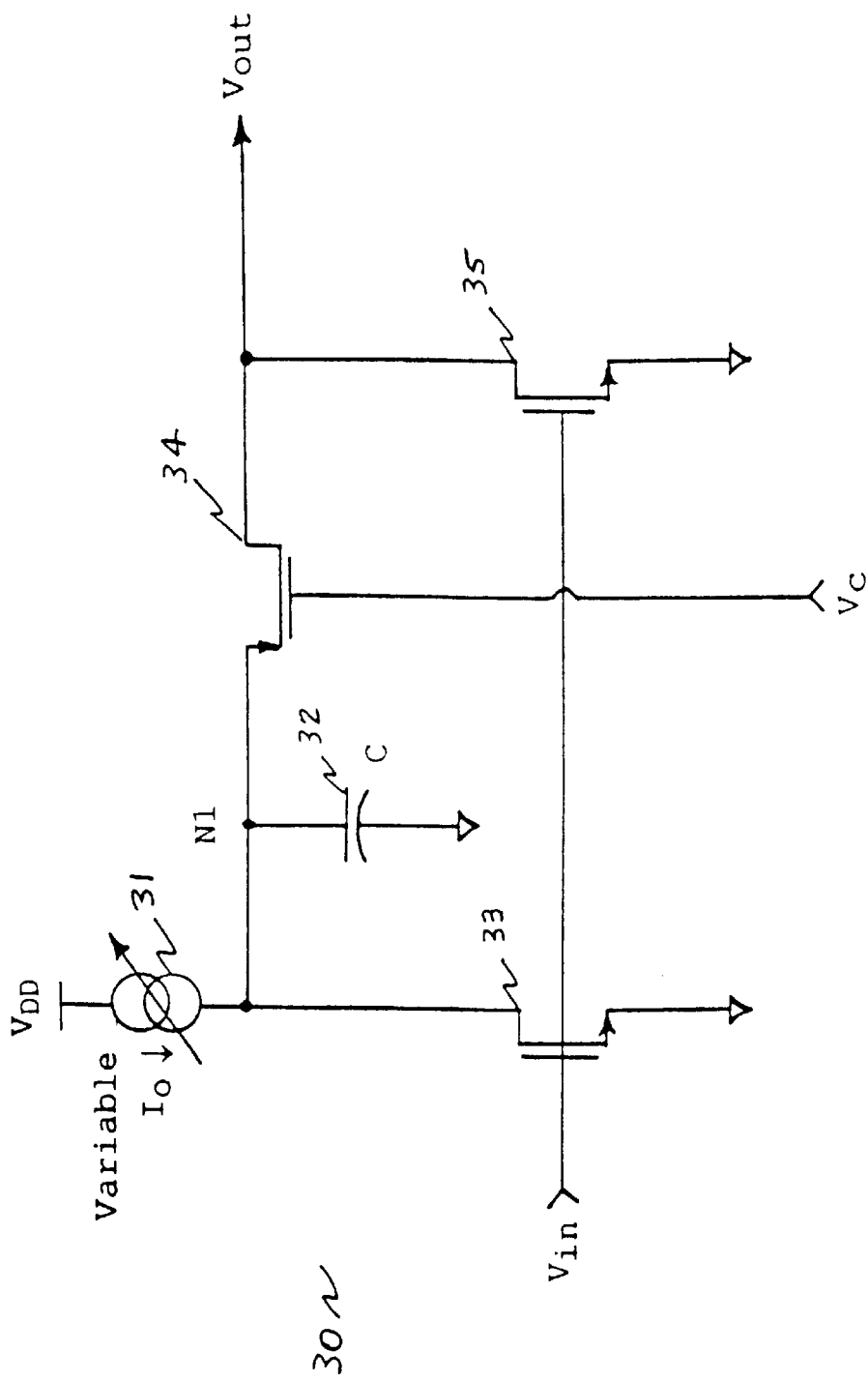
FIG. 7a is a schematic of the circuit of this invention with variable current delay control.

FIG. 7a shows a second embodiment of the circuit 30 of FIG. 4, where current delay control is added to the earlier circuit 20. Here, the current source 31 is made variable so as to be effective in selecting the charging rate of the charging capacitor 32. The remaining components in the circuit, including charging capacitor 32, input transistor 33, in-line transistor 34, and output transistor 35 are equivalent to those in the circuit 20 of FIG. 4; i.e., charging capacitor 22, input transistor 23, in-line transistor 24, and output transistor 25, respectively. So, with this embodiment the delay in the circuit can be controlled both by means of the trip point voltage ($V_c$) setting and the amount of charging current supplied from the current source 31.

Figure 7B:
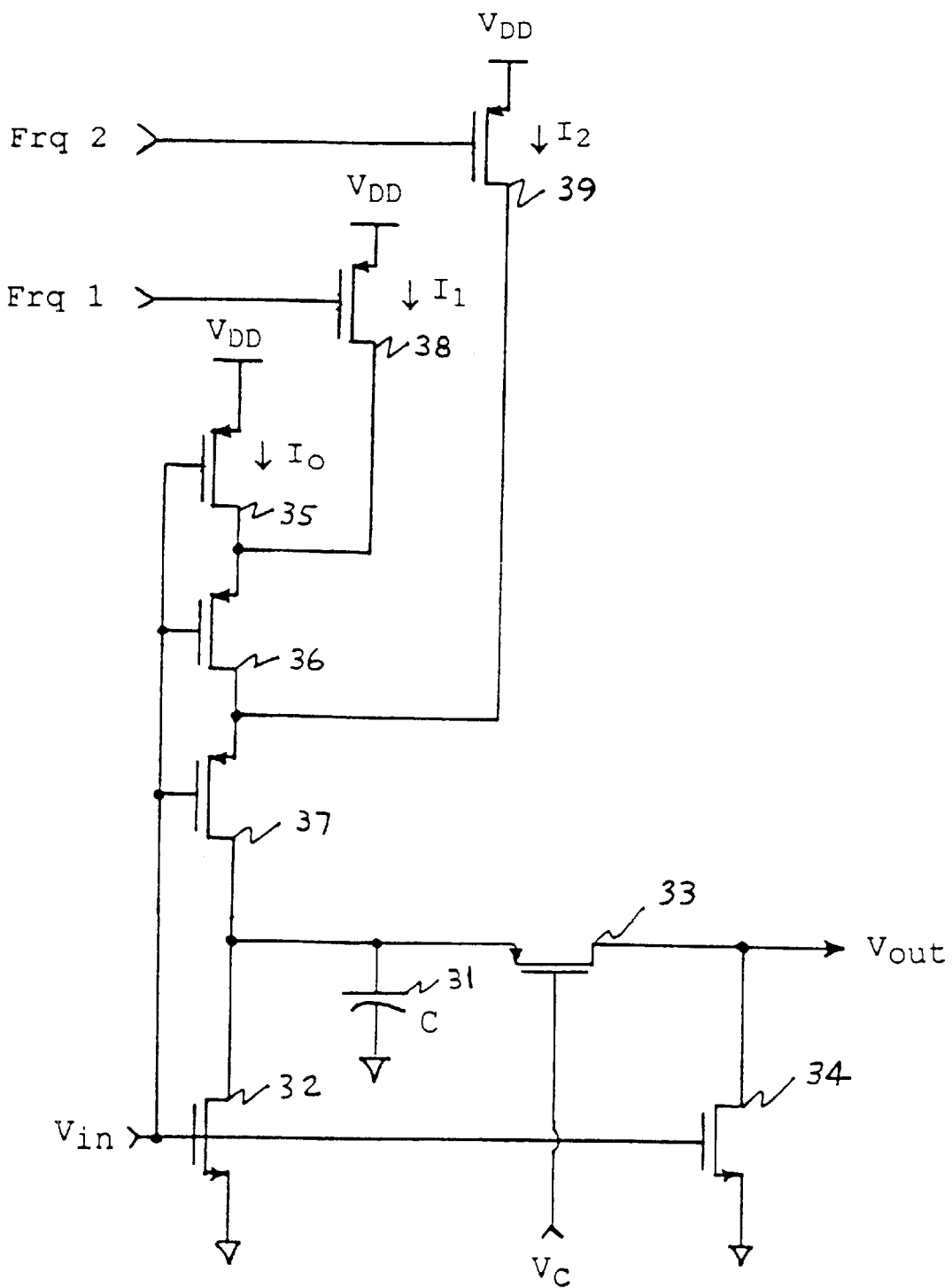
FIG. 7b is a schematic of the circuit of FIG. 7a as implemented with selectable charging current delay control.

FIG. 7b shows a schematic for an implementation of the circuit discussed above in FIG. 7a where the circuit's delay is controlled by varying the amount of charging current. In this case the variable current source consist of two selectable current sources which can be enabled individually or simultaneously to provide "fine" or "coarse" control of the circuit delay as a function of the capacitor's 31 charging current. The circuit is the same as that of FIG. 7a with the exception that the variable current source 31 is replaced by the circuitry comprising transistors 35–39. Here, three stacked p-channel transistors 35–37 are turned "ON" and "OFF" by means of the $V_{in}$ signal. The two charging currents, $I_1$ and $I_2$, are supplied by means of p-channel transistors 38 and 39, respectively. These two current sources are selected by means of signals Frq 1 and Frq 2. In the case where both transistors 38 and 39 are turned "OFF", a residual current $I_o$ is supplied to the circuit. The charging current can then be controlled by turning "ON" transistor 38 or transistor 39 or both simultaneously to control the amount of charging current to capacitor 31.

Figure 8:
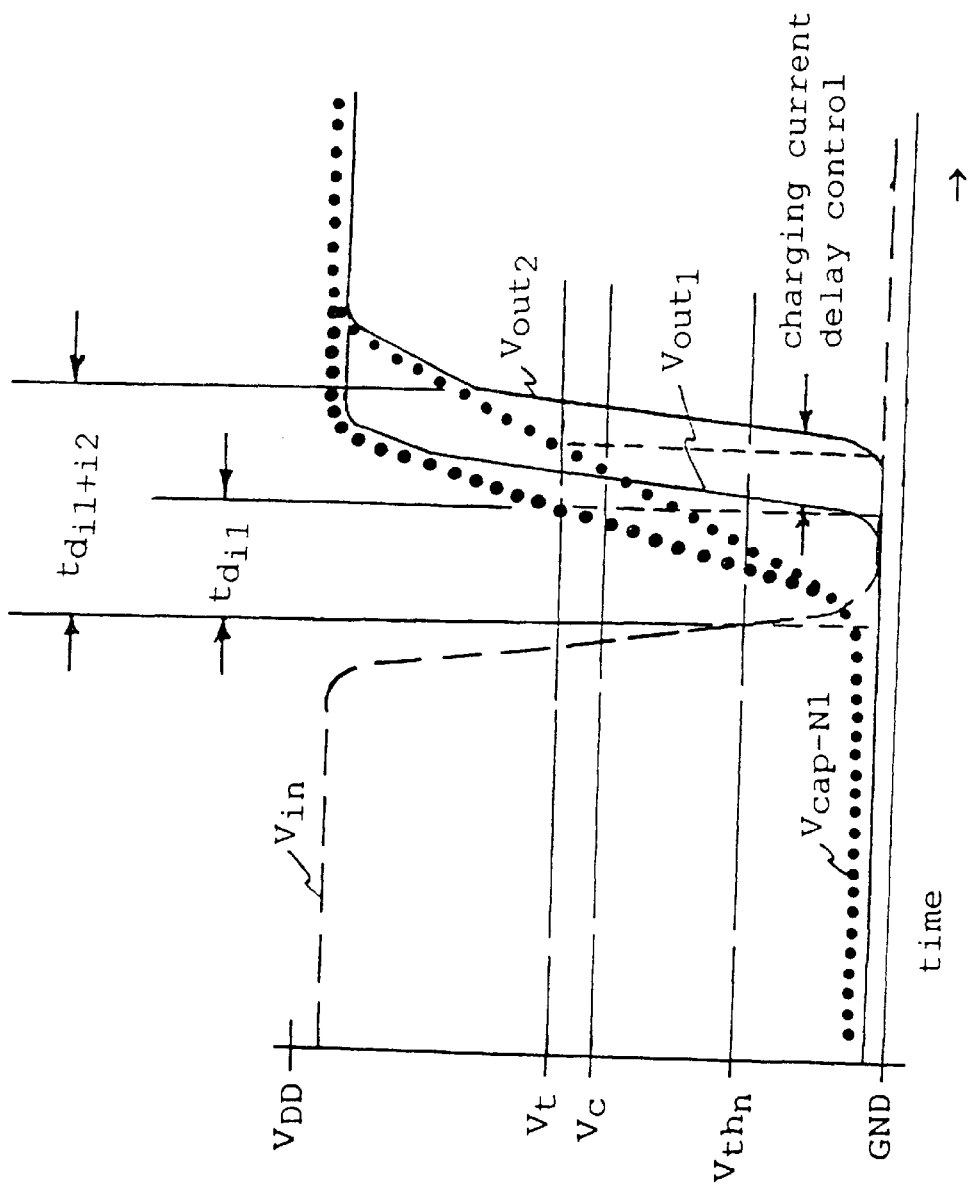
FIG. 8 is a timing diagram for the circuit of FIG. 7b showing the effects of charging current delay control.

FIG. 8 illustrates the charging current delay control, used to further control the amount of delay in the circuit's output signal. The diagram shows the change in slope of the capacitor's charging voltage, $V_{cap}$-N1, as the current sources, discussed above, are selected. The more charging current available, the faster the capacitor charges and as a result the sooner the $V_c+v_t$ threshold voltage is reached. This results in controlling the delay time before the output voltage pulls "HIGH." The difference in the delay is shown for one current source ($t_{dil}$) and both current sources ($t_{dil+i2}$).

Figure 9:
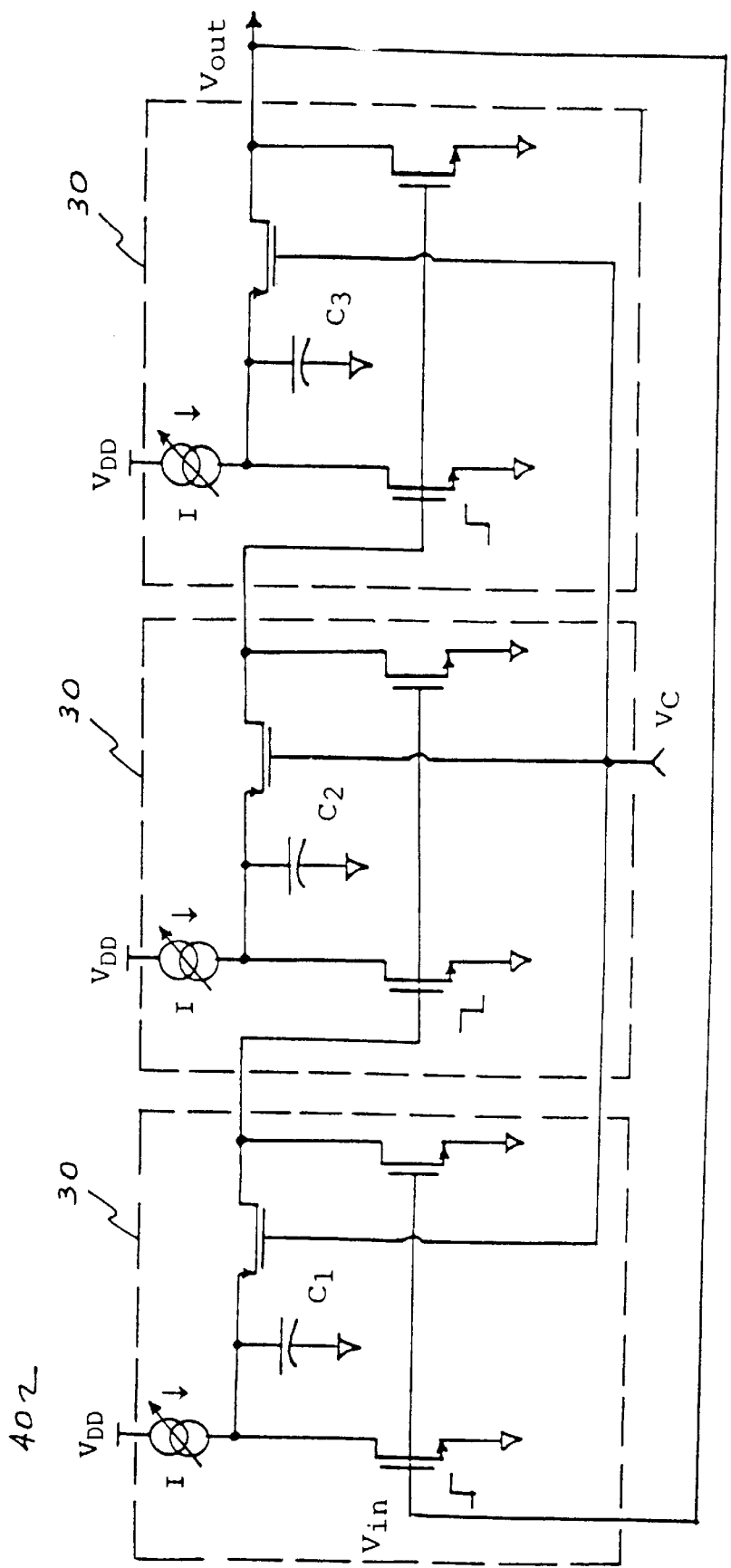
FIG. 9 is a schematic for a VCO implemented using the controlled delay inverter circuit of this invention.

An important application where the improvements of the disclosed circuit will be significant is that of the inverter element in a voltage controlled oscillator (VCO) 40, as shown in FIG. 9. Here, three of the inverter circuits 30 are coupled together to form the VCO. As shown, the output of the first stage is coupled to the input of the second stage, the output of the second stage is coupled to the input of the third stage, and the output of the third stage is feedback to the input of the first stage, to form an oscillator. The output of the oscillator is taken at the output of the third stage. The improvements to this basic VCO circuit are in the response time and in the controlled delay aspect, including both charging current and trip point voltage, of the circuit. Although the circuit of this invention addresses single-ended input signals, the same techniques apply for differential input signals, as well.

Figure 10:
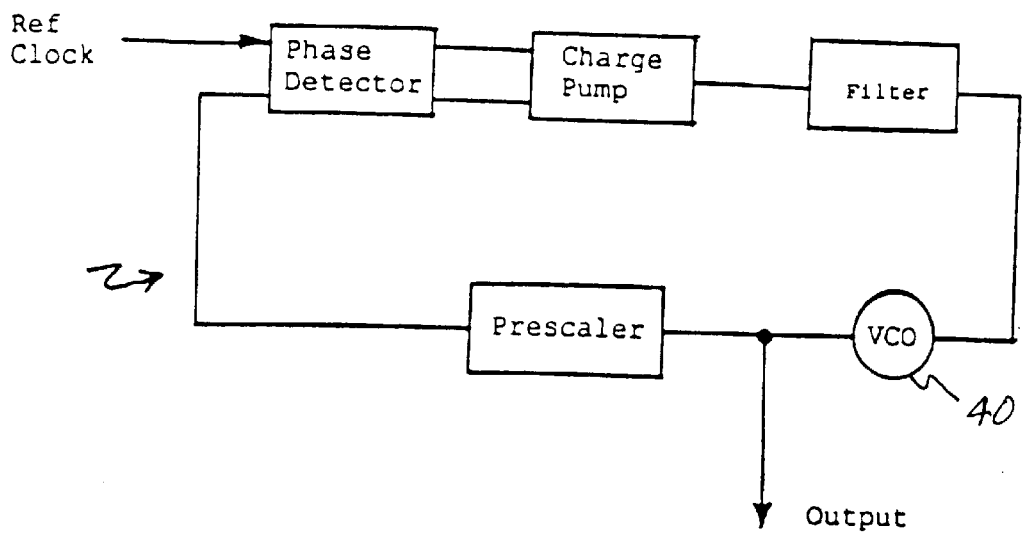
FIG. 10 is a block diagram of a typical phase-lock-loop (PLL) where the VCO is implemented using the improved circuit of this invention.

FIG. 10 is a block diagram for a typical phase-lock-loop (PLL) which includes a VCO utilizing the improved charging capacitor inverter circuit of this invention. The improved performance of this PLL circuit results in less circuit "jitter" and better frequency response.

Figure 11:
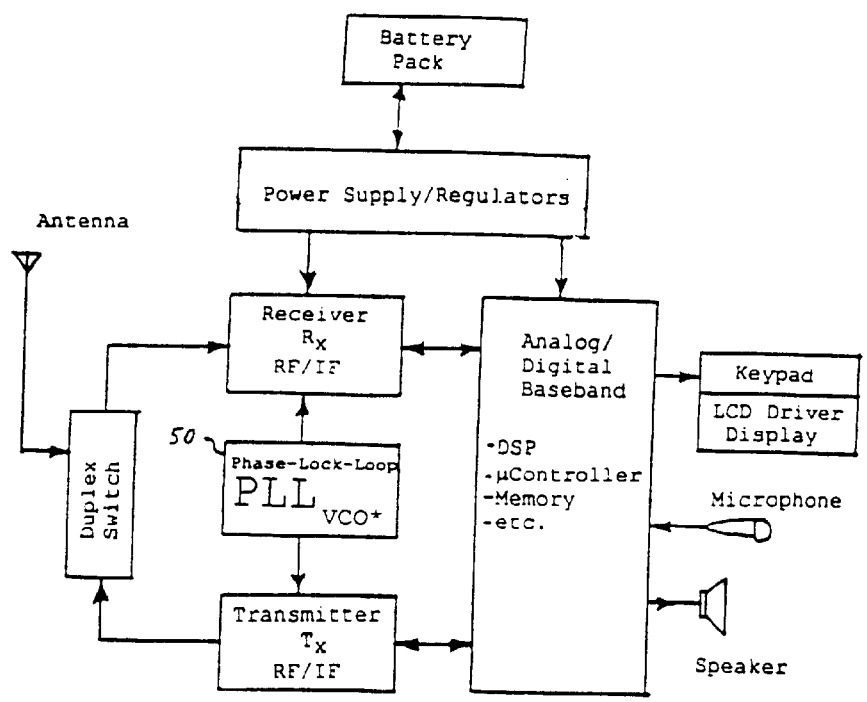
FIG. 11 is a block diagram for a typical wireless telephonic system which incorporates a VCO using the delay circuit improvement of this invention in the PLL portion of the system.

FIG. 11 shows a block diagram for a typical wireless transceiver (cellular phone) incorporating the present invention. The system is comprised of the receiver ($R_x$) and transmitter ($T_x$) RF/IF portions, the baseband controller functions, the power supply, and the user input/output functions. Of particular interest relative to the disclosed invention is the phase-lock-loop (PLL) 50 circuit which is comprised of a VCO implemented using the improved charging capacitor inverter circuits of this invention. Both fixed-band and multi-band wireless transceivers such as this will benefit significantly from the improved performance of this improved circuit.

While the invention has been described in the context of preferred embodiments, it will be apparent to those skilled in the art that the present invention may be modified in numerous ways and may assume embodiments, such as that for differential input signals, other than specifically set out and described above. Accordingly, it is intended by the appended claims to cover all modifications of the invention which falls within the true spirit and scope of the invention.

I claim:

1. A circuit for controlling the signal delay in a charging capacitor inverter by varying the trip point voltage level of an in-line trip point controlled transistor, thereby effecting the delay time before the circuit's output switches, wherein the in-line trip point controlled transistor is conductive when a voltage associated with a discrete charging capacitor exceeds the trip point voltage level of the inline trip point controlled transistor such that output signal jitter associated with the circuit is reduced below that achievable without use of an in-line trip point controlled transistor, wherein the circuit comprises:
   an input transistor;
   a charging capacitor;
   an in-line trip point controlled transistor, and
   an output transistor, and further wherein
   the output of said current source is coupled to the positive side of said charging capacitor, to the source of said in-line trip point transistor, and to the drain of said input transistor;
   the drain of said in-line trip point traitor is coupled to the drain of said output transistor and to the output signal terminal;
   a dc bias input control voltage is coupled to the gate of said in-line trip point transistor;
   an input signal is coupled to the gate of said input transistor and to the gate of said output transistor;
   a power supply voltage is coupled to the input of said current source; and
   the sources of said input and output transistors and the negative side of said charging capacitor are coupled to signal ground.

2. A circuit for controlling the signal delay in a charging capacitor inverter by varying the amount of charging current to a discrete charging capacitor, thereby effecting the charging rate of the discrete charging capacitor and as a result the delay time before the circuit's output switches, such that output signal jitter associated with the circuit is substantially reduced, wherein the circuit comprises;
   a variable current source;
   an input transistor;
   a charging capacitor;
   an in-line trip point controlled transistor; and
   an output transistor, and further wherein
   the output of said variable current source is coupled to the positive side of said charging capacitor, to the source of said in-line trip point transistor, and to the drain of said input transistor;
   the drain of said in-line trip point transistor is coupled to the drain of said output transistor and to the output signal terminal;
   a dc bias input control voltage is coupled to the gate of said in-line trip point transistor;
   an input signal is coupled to the gate of said input transistor and to the gate of said output transistor;
   a power supply voltage is coupled to the input of said variable current source; and
   the sources of said input and output transistors and the negative side of said charging capacitor are coupled to signal ground.

3. The circuit of claim 2, wherein said variable current source is comprised of two or more selectable fixed current sources.

4. A circuit for controlling the signal delay in a charging inverter by varying the amount of charging current to a discrete charging capacitor, thereby effecting the charging rate of the discrete charging capacitor and as a result the delay time before the circuit's output switches, such that output signal jitter associated with the circuit is substantially reduced, wherein the circuit comprises:
   a variable current source;
   an input transistor;
   a charging capacitor;
   an in-line trip point controlled transistor; and
   an output transistor, and further wherein said variable current source is comprised of two or more selectable fixed current switch transistor is coupled to the sources; and further wherein
   the drain of a first current switch transistor is coupled to the source of a second current switch transistor and to the drain of a first current source transistor;
   the drain of second current switch transistor is coupled to the source of a third current switch transistor and to the drawing of a second current source transistor;
   the output of said third current switch transistor is coupled to the positive side of said charging capacitor, to the source of said in-line trip point transistor, and to the drain of said input transistor;
   the gates of said first and second current source transistors are respectively coupled to first and second current source selector input signals;
   the drain of said in-line trip point transistor is coupled to the drain of said output transistor and to the output signal terminal;
   a dc bias input control voltage is coupled to the gate of said in-line trip point transistor;
   an input signal is coupled to the gate of said input transistor, to the gate of said output transistor, and to the gate of said first, second, and third current switch transistors, respectively;
   a power supply voltage is coupled to source of said first current switch transistor and to the sources of said first and second current source transistor, respectively; and
   the sources of said input and output transistors and the negative side of said charging capacitor are coupled to signal ground.

5. A circuit for controlling the signal delay in a charging capacitor inverter by varying the trip point voltage level of an in-line trip point controlled transistor, thereby effecting the delay time before the charging capacitor inverter output switches, wherein the in-line trip point controlled transistor is conductive when a voltage associated with a discrete charging capacitor exceeds the trip point voltage level of the in-line trip point controlled transistor such that output signal jitter associated with the charging capacitor inverter is reduced below that achievable without use of an in-line trip point controlled transistor, and further wherein the circuit for controlling the signal delay comprises the in-line trip point controlled transistor and an opposite channel type transistor connected oppositely to the in-line trip point controlled transistor, and further wherein the in-line trip point controlled transistor is controlled by a different voltage than that which changes, to an extent, operation of the charging capacitor inverter.

* * * * *